(12) United States Patent
Mohanty et al.

(10) Patent No.: US 7,231,616 B1
(45) Date of Patent: Jun. 12, 2007

(54) METHOD AND APPARATUS FOR ACCELERATING TEST CASE DEVELOPMENT

(75) Inventors: Purna Mohanty, Santa Clara, CA (US); Sivam Thangavelu, San Jose, CA (US); Vivek Jambhekar, Mountain View, CA (US)

(73) Assignee: Adaptec, Inc., Milpitas, CA (US)

( * ) Notice: Subject to any disclaimer, the term of this patent is extended or adjusted under 35 U.S.C. 154(b) by 427 days.

(21) Appl. No.: 10/645,729

(22) Filed: Aug. 20, 2003

(51) Int. Cl.
*G06F 17/50* (2006.01)
(52) U.S. Cl. ......................................................... 716/4
(58) Field of Classification Search .................... 716/4; 714/724; 717/124
See application file for complete search history.

(56) References Cited

U.S. PATENT DOCUMENTS

| | | | |
|---|---|---|---|
| 6,182,245 B1* | 1/2001 | Akin et al. ..................... | 714/38 |
| 6,810,364 B2* | 10/2004 | Conan et al. .................. | 702/188 |
| 7,000,224 B1* | 2/2006 | Osborne et al. ............... | 717/125 |
| 7,137,087 B1* | 11/2006 | Mohanty et al. ............... | 716/5 |
| 7,143,376 B1* | 11/2006 | Eccles ........................... | 716/5 |
| 7,158,924 B2* | 1/2007 | Williams et al. .............. | 703/17 |
| 2002/0073374 A1* | 6/2002 | Danialy et al. ................ | 714/738 |
| 2002/0173943 A1* | 11/2002 | Armbruster et al. .......... | 703/15 |
| 2003/0051163 A1* | 3/2003 | Bidaud .......................... | 713/201 |
| 2003/0056173 A1* | 3/2003 | Copenhaver et al. ......... | 715/513 |
| 2003/0101382 A1* | 5/2003 | Gabele et al. ................. | 714/39 |
| 2003/0191869 A1* | 10/2003 | Williams et al. .............. | 709/328 |
| 2003/0196191 A1* | 10/2003 | Hartman et al. .............. | 717/126 |
| 2003/0208351 A1* | 11/2003 | Hartman et al. .............. | 703/22 |
| 2006/0229858 A1* | 10/2006 | Devins et al. ................. | 703/14 |

* cited by examiner

*Primary Examiner*—Paul Dinh
*Assistant Examiner*—Suchin Parihar
(74) *Attorney, Agent, or Firm*—Martine Penilla & Gencarella, LLP

(57) ABSTRACT

A system configured to minimize validation time associated with an integrated circuit design is provided. The system includes a client and a server. The client is configured to identify a test case for simulation with the integrated circuit design. The client is further configured to generate a verified file from the test case. The server is in communication with the client. The server is configured to maintain an initialized state. The server, when in the initialized state, is configured to receive the verified file from the client for execution, wherein after execution of the verified file, the server is enabled to communicate results to the client and the server resets to the initialized state. A method for submitting a test case for simulation of an integrated circuit design and a computer readable medium are also provided.

18 Claims, 4 Drawing Sheets

METHOD AND APPARATUS FOR ACCELERATING TEST CASE DEVELOPMENT

CROSS REFERENCE TO RELATED APPLICATIONS

This application is related to U.S. patent application Ser. No. 10/645,789, filed on the same day as the instant application and entitled "INTEGRATED CIRCUIT VERIFICATION SCHEME." This application is hereby incorporated by reference in its entirety.

BACKGROUND OF THE INVENTION

1. Field of the Invention

The present invention relates generally to validation of chip designs, and more specifically to application specific integrated circuit (ASIC) validation schemes that reduce the validation time by accelerating test case development without sacrificing quality.

2. Description of the Related Art

Development timelines for integrated circuits (ICs) are constantly being evaluated in order to identify efficiencies for reducing the development timeline in order to make the IC available to the market as fast as possible. At the design stage for an integrated circuit, a circuit design is typically represented as circuit data in a hardware description language (HDL). From the HDL, the circuit design can be mapped (through suitable processing) into an actual hardware design for fabrication in an integrated circuit. Standards exist for HDLs, e.g., Verilog standards.

The testing of circuit designs prior to fabrication in an integrated circuit is referred to in the art as verification and validation, and represents an important step in the design process for an integrated circuit. With the complexity of circuits increasing continuously, it is impossible to guarantee the proper operation of a design without undergoing an extensive prior verification and validation of the design. The HDL-based design methodology requires the user to describe the behavior of a system which may then be simulated (a process referred to as Register Transfer Level (RTL) simulation) to determine whether it will function as desired. The design is then synthesized to create a logical netlist that can be implemented within a particular Programmable Logic Device (PLD) or a particular PLD vendor's device group. Assuming that neither the synthesis or the design implementation processes alter the behavior of the design, RTL simulation provides the designer with insight into the functionality and behavior of the implemented device before the costly and time consuming synthesis and design implementation processes take place. If accurate, RTL simulation represents a quick and efficient means of validating a design's (and ultimately, a programmed device's) behavior.

During the validation process, complete testcases are created as a macrolevel Verilog task. The test cases are compiled along with the testbench and the design. And the simulation is then run. Once the simulation is run it is determined whether the goal of the test case is met. If the goal of the test case is not met, then the RTL is checked. If the RTL check is satisfactory, then the tasks defining the test case are adjusted. It should be appreciated that this process is iterative until the desired tasks for the testcase are determined. At each iteration, the newly defined testcase must be compiled, which consumes CPU resources of the computer system running a commercially available simulation program, e.g., a verilog based simulation program, as well as seat licenses for the simulation program.

As licenses are generally structured to allow a user to perform a compilation or a simulation, and not both at the same time, the user will either have to wait for a license to be available if a simulation is running, or use an additional seat license for the compilation. Thus, an organization will generally have to purchase additional seat licenses to avoid the downtime. Furthermore, the compilations are costly in terms of the design engineer's time and are a bottleneck in the validation process.

Another shortcoming of the current validation process is that the initialization of the chip model may require 30 minutes or more. Thus, for each test case a thirty minute initialization process is incurred. Accordingly, as test cases are developed and modified throughout the validation and verification schemes, the thirty minute initialization periods begin to add up to a significant amount of time. The design engineer is basically idle during the wait period for the initialization, thereby resulting in the inefficient use of his/her time. In addition, a seat license for the software associated with the validation process is consumed during this inactive initialization period.

In light of the foregoing, it is desired to implement a scheme to reduce the initialization time for the chip model during test case development in order to more efficiently perform the validation of a design of an integrated circuit.

SUMMARY OF THE INVENTION

Broadly speaking, the present invention fills these needs by providing a scheme for maintaining a simulation server in an initialized state. The present invention can be implemented in numerous ways, including as a process, an apparatus, a system, a device, or a method. Several embodiments of the present invention are described below.

In one embodiment, a method for submitting a test case for simulation of an integrated circuit design is provided. The method initiates with identifying a test case associated with a client. Then, the test case is verified at the client. Next, the test case is submitted to a pre-initialized simulation server from the client. Then, the test case is executed on the pre-initialized simulation server. Next, results from the test case execution are communicated to the client. Then, a reset and initialization sequence is executed at the pre-initialized simulation server to maintain the pre-initialized simulation server in an initialized state for a next test case.

In another embodiment, a computer readable medium having program instructions for minimizing simulation time overhead associated with the validation of an integrated circuit design is provided. The computer readable medium includes program instructions for executing a reset and initialization sequence at a server to maintain the server in an initialized state. Program instructions for receiving a verified test case from a client in communication with the server are provided. Program instructions for executing the test case and recording results associated with execution of the test case and program instructions for communicating the results to the client are included. Program instructions for resetting the server to maintain the initialized state for receiving a next test case are provided.

In still yet another embodiment, a system configured to minimize validation time associated with an integrated circuit design is provided. The system includes a client and a server. The client is configured to identify a test case for simulation with the integrated circuit design. The client is further configured to generate a verified file from the test case. The server is in communication with the client. The server is configured to maintain an initialized state. The server, when in the initialized state, is configured to receive the verified file from the client for execution, wherein after execution of the verified file, the server is enabled to communicate results to the client and the server resets to the initialized state.

Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

An invention is described for a system, device and method for submitting a test case for simulation of an integrated circuit (IC) design in a manner that avoids waiting for the chip initialization by utilizing a pre-initialized simulation server. In other instances, well known process operations have not been described in detail in order not to unnecessarily obscure the present invention. The term about as used to herein refers to +/−10% of the referenced value.

The embodiments of the present invention provide a system and method for avoiding the waiting period associated with the initialization of a model of a chip design during the development of an integrated circuit. Numerous test cases are developed and run on a model of an integrated circuit (IC) during the development phase of the IC. In order to eliminate the waiting period associated with the initialization of the system, which may be 30 minutes long or more, a server running the simulation is maintained in an initialized state. Thus, a client in communication with the server may generate a pre-compiled file associated with the test case. The pre-compiled file is then transmitted to the server, which is maintained in an initialized state, and the server executes the simulation. The simulation results are then communicated back to the client to determine if the goal associated with the test case has been achieved. Accordingly, the simulation operations are performed in parallel on the server and the client in order to complete the validation of the chip design in an efficient manner, i.e., without incurring significant wait periods where a design engineer is idle.

Figure 1:
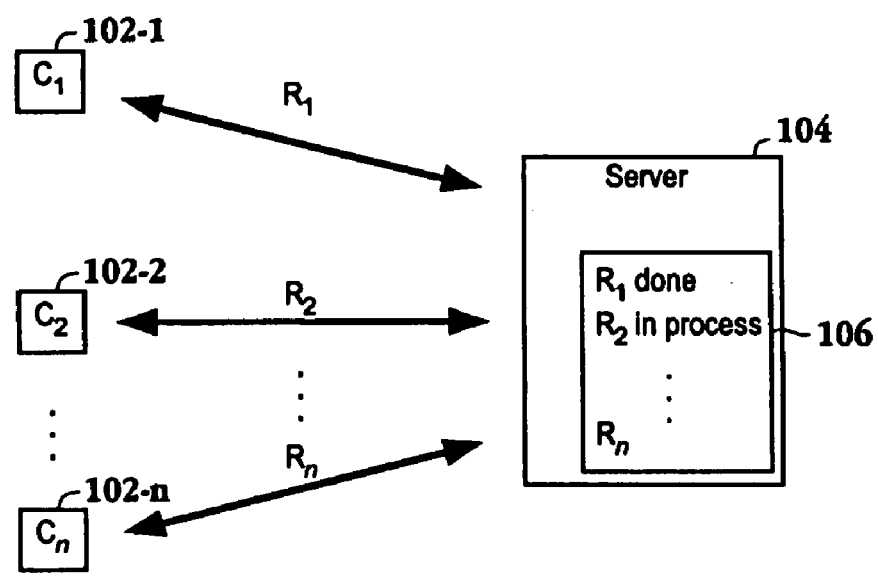
FIG. 1 is a simplified schematic diagram of a client server relationship configured to accelerate test case development time in accordance with one embodiment of the invention.

FIG. 1 is a simplified schematic diagram of a client server relationship configured to accelerate test case development time in accordance with one embodiment of the invention. Clients 102-1 through 102-$n$ are in communication with server 104. It should be appreciated that clients 102-1 through 102-$n$ may be in communication with server 104 over a network, e.g., a distributed network, such as the Internet or an internal network, such as an organization's intranet. Furthermore, clients 102-1 through 102-$n$ may be any suitable general purpose computer. Likewise, server 104 may also be a general purpose computer. Each of clients 102-1 through 102-$n$ are configured to transmit requests $R_1$ through $R_n$ respectively, to server 104. As will be explained in more detail below, requests $R_1$ through $R_n$ are text files that have been pre-processed by respective client 102-1 through 102-$n$ in order to verify syntax and format. Server 104 is maintained in an initialized state in order to execute each of the test cases embodied in the respective requests.

In one embodiment server 104 of FIG. 1 maintains an initialization state by executing a re-set and chip initialization sequence stored on a suitable storage media associated with server 104. Server 104 includes queue 106 which maintains a status of the various requests received by server 104. Queue 106 indicates that request # 1, $R_1$, has been completed, request # 2, $R_2$, is in process, and request # N, $R_n$, has not yet been run in this particular illustration. Thus, prior to executing $R_1$, server 104 was in a initialized state, then after the processing of $R_1$ the server is re-initialized in order to begin processing $R_2$, and so on. Thus, by defining the client server relationship where the server is maintained in an initialized state, the wait period associated with initialization of the chip model is eliminated. Additionally, queue 106 allows a number of clients to interface with server 104 so that the test cases, i.e., the requests for running the test cases may be stacked in the queue in order to further make the process more efficient. Consequently, the design engineer is freed up to do more test development or other associated tasks.

Figure 2A:
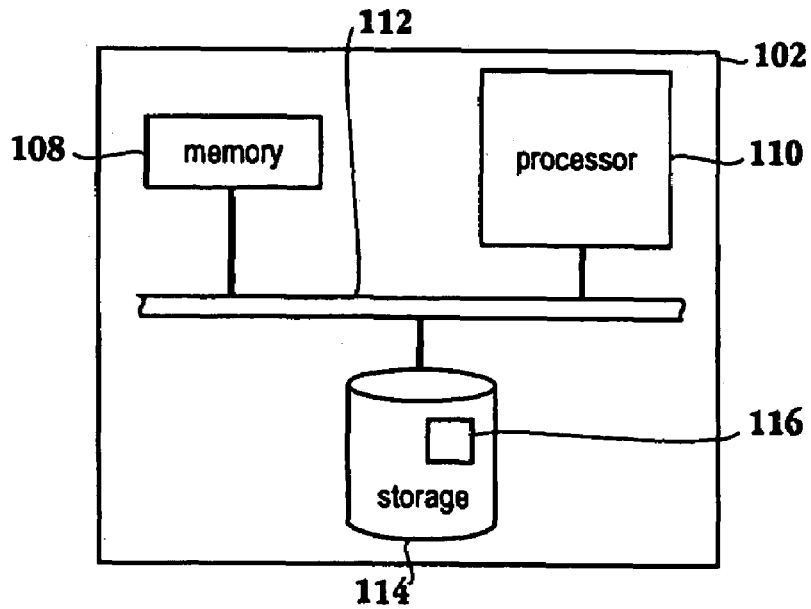
FIG. 2A is a simplified schematic diagram of the components of a client configured to enable acceleration of test case development time in accordance with one embodiment of the invention.

FIG. 2A is a simplified schematic diagram of the components of a client configured to enable acceleration of test case development time in accordance with one embodiment of the invention. In one embodiment, the system of FIG. 2A is a general computer system. Client 102 includes processor 110, memory 108 and storage media 114. Bus 112 enables communication between processor 110, memory 108 and storage media 114. In one embodiment, storage media 114 includes precompiled files 116 as discussed with reference to application Ser. No. 10/645,789 which has been incorporated by reference. In another embodiment, precompiled files 116 are verilog tasks.

Figure 2B:
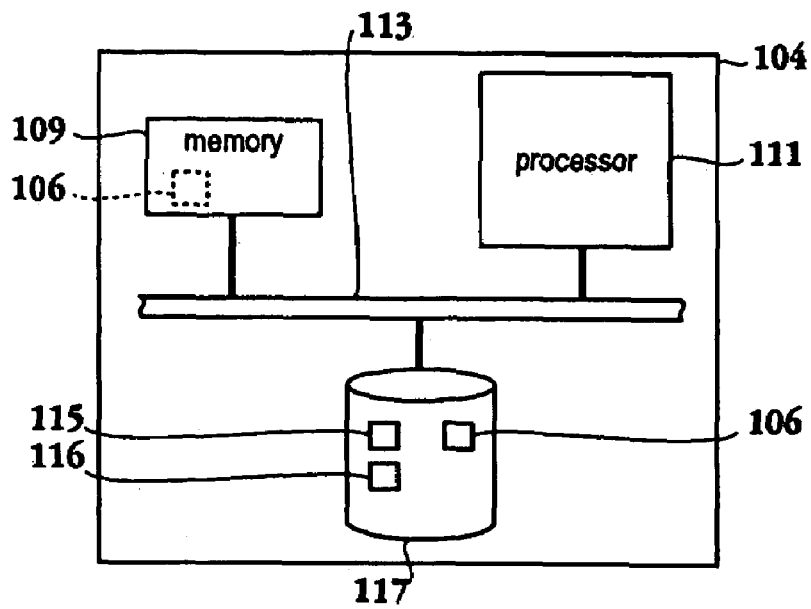
FIG. 2B is a simplified schematic diagram of the components of a server configured to enable acceleration of test case development time in accordance with one embodiment of the invention.

FIG. 2B is a simplified schematic diagram of the components of a server configured to enable acceleration of test case development time in accordance with one embodiment of the invention. Server 104 includes processor 111 memory 109 and storage media 117, all of which are connected through bus 113. Storage media 117 includes chip initialization sequence 115 and queue 106. It will be apparent to one skilled in the art that queue 106 alternatively may reside in memory 109 or even in a separate first in first out (FIFO) buffer. Once server 104 completes a simulation execution the server is re-initialized using the chip initialization data of storage 117. It will be apparent to one skilled in the art that both, storage 114 and storage 117, of client 102 and server 104, respectively, may be located internal or external to the respective client or server. In addition, storage media 117 is configured to store precompiled files 116. Accordingly, server 104 may run the simulation using precompiled files 116, which are associated with the text based files delivered to server 104 from any of the clients. One skilled in the art will appreciate that storage media may include any suitable storage media, such as hard drives, compact discs, magnetic tapes, etc.

Figure 3:
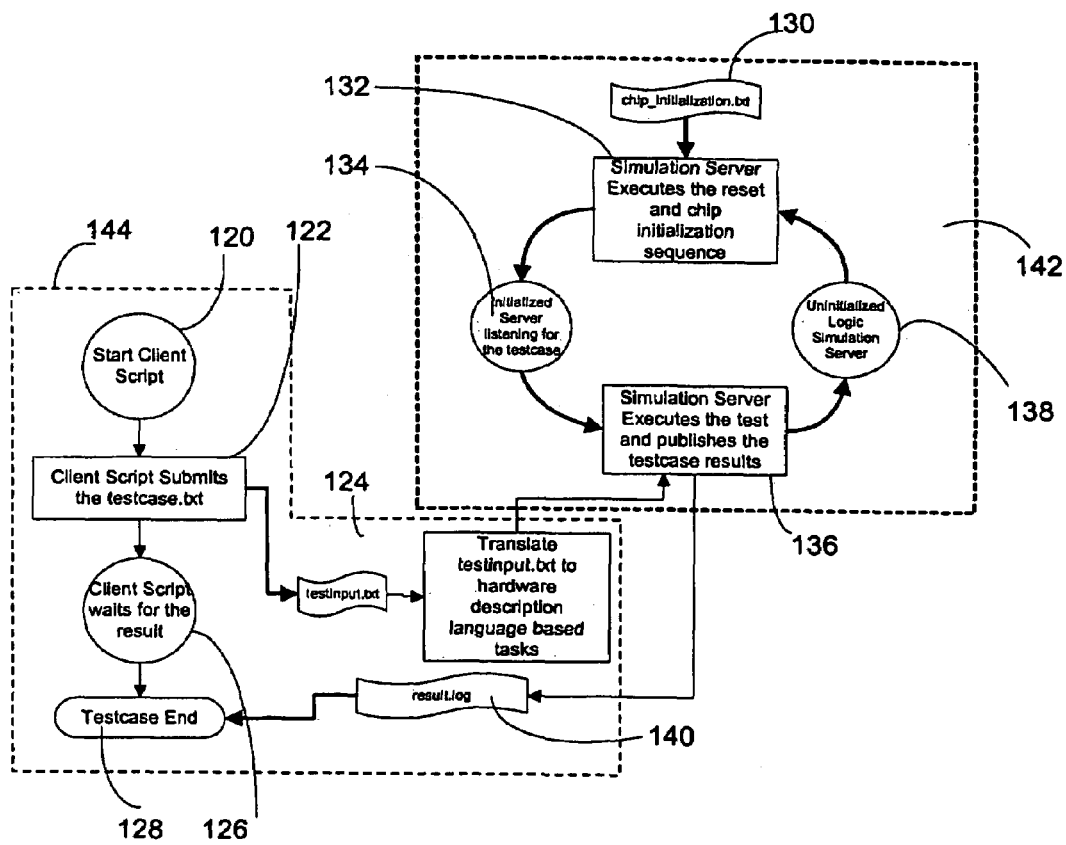
FIG. 3 is a block diagram illustrating the execution flow for a client server system configured to accelerate test case development in accordance with one embodiment of the invention.

FIG. 3 is a block diagram illustrating the execution flow for a client server system configured to accelerate test case development in accordance with one embodiment of the invention. The client server system includes two main components, i.e., server component 142 and client component 144. Client component 144 executes client script 120. In one embodiment, client component 144 is configured to read a text file. In block 122 the client script, which was initiated in block 120, submits the test case. The test case may include a group of tasks, i.e., macro tasks. The tasks associated with the test case is written as a text file. It should be appreciated that since the initialization sequence is stored on the server side, the initialization sequence is not needed as part of the test case being submitted to server component 142. The client script then creates a testinput.txt file which is used to submit to server component 142 and the client script then waits for the result of the server execution as illustrated in block 126.

The testinput.txt file of block 124 of FIG. 3 is a preprocessed file in which syntax and format errors associated with the testcase.txt file have been checked. Thus, a verified file is generated that is then moved to the data stream where the server component 142 is running. In one embodiment, testinput.txt of block 124 includes text-based tasks associated with precompiled hardware description language based tasks. In one embodiment, a translation layer correlates the text based tasks to hardware description language based tasks. Further details of the pre-processing operation, the translation operation, the text based tasks and the precompiled tasks are contained in application Ser. No. 10/645,789 which has been incorporated by reference. Server component 142 maintains the server in an initialized state as mentioned above. Here, chip initialization text of block 130 is executed by a simulation server. The simulation server executes the re-set and chip initialization sequence in block 132. The initialized server is maintained in the initialized state, awaiting for a test case to be delivered from client side 144 as illustrated in block 134. Thus, when the testinput.txt file block 124 is moved into the data stream of the server component 142, the simulation server is available to immediately process and execute the test case associated with the testinput.txt file. Accordingly, the simulation server executes the test and publishes the test case results in block 136.

Once the test has completed, the simulation server is uninitialized in block 138 of FIG. 3. The chip initialization test is then re-run in order to initialize the simulation server and the process is repeated as illustrated on the server component 142 of FIG. 3. Upon completion of the test case in block 136, the server moves the test case results to the client side as a result.log in block 140. The result.log of block 140 is then communicated to the client script which is waiting in block 126. Thus, the system described above eliminates the need for waiting for any database to be linked or the need for re-setting the chip and completing the initialization sequence prior to executing the test case.

Figure 4:
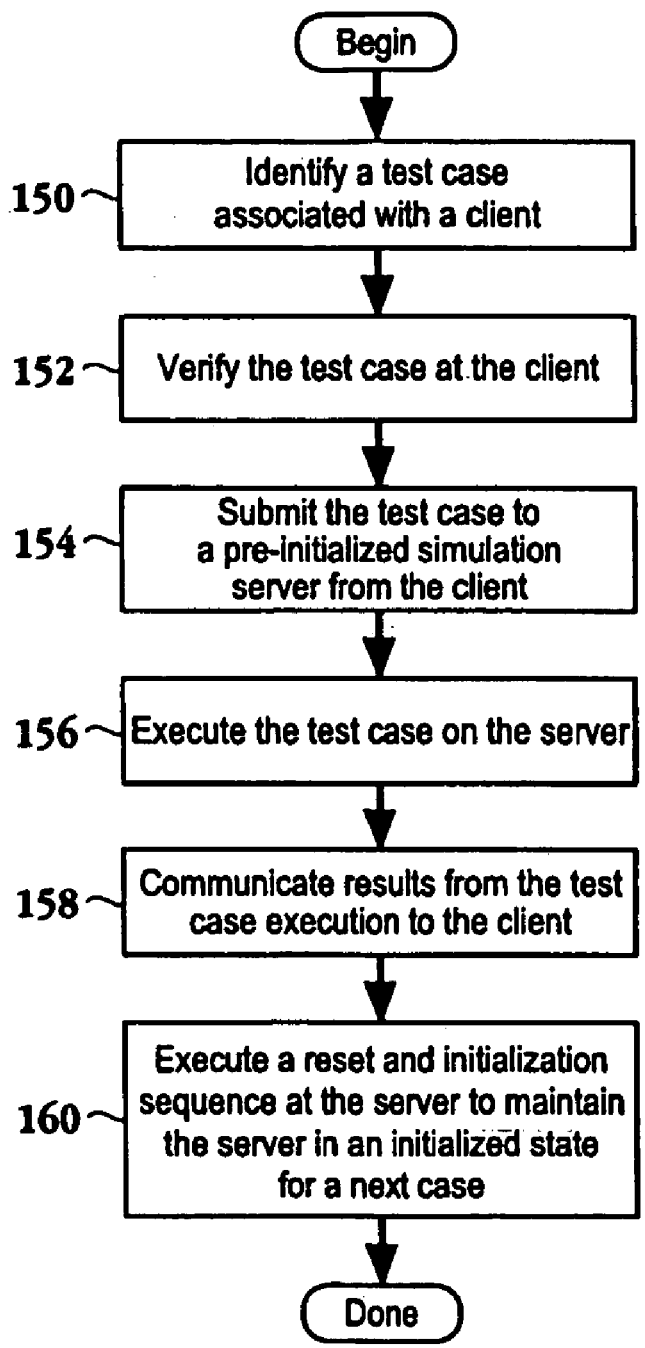
FIG. 4 is a flow chart diagram illustrating the method operations for submitting a test case for simulation of a integrated circuit design in accordance with one embodiment of the invention.

FIG. 4 is a flow chart diagram illustrating the method operations for submitting a test case for simulation of a integrated circuit design in accordance with one embodiment of the invention. The method initiates with operation 150 where a test case associated with the client is identified. Here, the test case includes the tasks designed to stimulate the model of the integrated circuit in order to achieve a specified goal. The method then advances to operation 152 where the test case is verified at the client. In one embodiment, the test case, i.e., the text file, is verified for syntax errors and format errors. The method then proceeds to operation 154 where the test case is submitted to a pre-initialized simulation server. Here, the client moves the test case into a data stream associated with the server. As the server is pre-initialized, there is no need to include an initialization task with the test case. Furthermore, the validation for syntax errors may be performed while the simulation server is initializing in order to gain efficiencies. That is, efficiencies are gained through a parallel processing concept.

The method of FIG. 4 then moves to operation 156 where the test case is executed on the simulation server. Here, a device under test (DUT) is initialized and ready to execute the test case in order to simulate the performance of the chip design on the simulation server. The method then advances to operation 158 where the results from the test case execution are communicated from the server to the client. Here, a result.log file is communicated to the client side. That is, the result.log file is moved to a data stream associated with the client. The method then proceeds to operation 160 where a re-set and initialization sequence at the server is executed to maintain the server in an initialized state. Accordingly, the server is maintained in an initialized state for a next test case. As mentioned above, the next test case may be received directly from the client. Alternatively, the server may include a queue in which test cases are stacked and executed in order of receipt.

In summary, the present invention provides a scheme for accelerating test case development. The scheme includes a client component and a server component in communication with each other. The client component provides verified text based tasks to the server component. The server component includes a simulation server that is maintained in an initialized state through the execution of a chip initialization sequence. The pre-initialized server allows for the elimination of the waiting period associated with the initialization process. Additionally, it is unnecessary for the client component to deliver a task associated with the initialization to the simulation server. The simulation server includes a queue enabling the storage of test cases from a plurality of clients. Thus, once one test case is run, the simulation server may uninitialize and then execute the chip initialization sequence to run the next test case, and so on. It should be appreciated that a design engineer is not held idle waiting for the initialization to complete prior to running a test case. Consequently, the design engineer may take advantage of the efficiencies gained in developing and running the test cases by performing other development tasks.

With the above embodiments in mind, it should be understood that the invention may employ various computer-implemented operations involving data stored in computer systems. These operations include operations requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The above described invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a communications network.

The invention can also be embodied as computer readable code on a computer readable medium. The computer readable medium is any data storage device that can store data which can be thereafter read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for submitting a test case for simulation of an integrated circuit design, comprising:
   identifying a test case associated with a client;
   verifying the test case at the client;
   submitting the test case to a pre-initialized simulation server from the client;
   associating text file based tasks of the test case to hardware description language (HDL) based tasks;
   executing the HDL based tasks on a model of an integrated circuit design associated with the simulation server;
   communicating results from the test case execution to the client; and
   executing a reset and initialization sequence at the pre-initialized simulation server to maintain the pre-initialized simulation server in an initialized state for a next test case.

2. The method of claim 1, wherein the method operation of verifying the test case at the client includes,
   checking a syntax and a format of tasks defining the test case.

3. The method of claim 1, wherein the results are formatted as a results.log file.

4. The method of claim 1, further comprising:
   providing a queue associated with the pre-initialized simulation server, the queue configured to store the test case.

5. The method of claim 1, wherein the method operation of communicating results from the test case execution to the client includes,
   uninitializing the simulation server.

6. The method of claim 1, wherein the method operation of executing the test case on the pre-initialized simulation server includes,
   translating each text based task associated with the verified test case to a compiled hardware description language (HDL) task.

7. The method of claim 6, wherein the compiled HDL task is stored on a storage media associated with the simulation server.

8. A computer readable medium in which program instructions are stored, which instructions, when read by a computer, cause the computer to perform a method for minimizing simulation time overhead associated with the validation of an integrated circuit design, the method comprising:
   executing a reset and initialization sequence at a server to maintain the server in an initialized state;
   receiving a verified test case from a client in communication with the server;
   associating text-file based tasks of the test case to hardware description language (HDL) based tasks;
   executing the HDL based tasks on a model of an integrated circuit design associated with the server recording results associated with execution of the test case;
   communicating the results to the client; and
   resetting the server to maintain the initialized state for receiving a next test case.

9. The computer readable medium of claim 8, wherein executing the test case and recording results associated with execution of the test case includes,
   translating each of a text-based task associated with the verified test case to a compiled hardware description language (HDL) task.

10. The computer readable medium of claim 8, wherein communicating the results to the client includes,
    uninitializing the server.

11. The computer readable medium of claim 8, wherein communicating the results to the client includes,
    generating a results.log file.

12. A system configured to minimize validation time associated with an integrated circuit design, comprising:
    a client, the client configured to identify a test case for simulation with the integrated circuit design, the client further configured to generate a verified file from the test case, wherein the verified file includes text based tasks associated with hardware description language (HDL) based tasks;
    a server in communication with the client; the server configured to maintain an initialized state, the server when in the initialized state configured to receive the HDL based tasks of the verified file from the client for execution, wherein after execution of the HDL based tasks of the verified file on a model of an integrated circuit design associated with the server, the server is enabled to communicate results to the client and the server resets to the initialized state.

13. The system of claim 12, further comprising:
    a storage medium in communication with the server, the storage medium configured to store compiled hardware description language based tasks corresponding to text based tasks associated with the verified file.

14. The system of claim 12, further comprising:
    a network providing a communication pathway between the server and the client.

15. The system of claim 12, wherein the verified filed includes a sequence of text-based tasks.

16. The system of claim 12, wherein the results are contained within a log-based file.

17. The system of claim 12, wherein the server further includes a queue, the queue configured to store a plurality of verified files.

18. The system of claim 12, wherein both the client and the server are general purpose computers.

* * * * *